(12) United States Patent  
di Vincenzo et al.

(10) Patent No.: US 12,300,316 B2  
(45) Date of Patent: May 13, 2025

(54) CASCODED SENSE AMPLIFIERS FOR SELF-SELECTING MEMORY

(71) Applicant: Micron Technology, Inc., Boise, ID (US)

(72) Inventors: Umberto di Vincenzo, Capriate San Gervasio (IT); Ferdinando Bedeschi, Biassono (IT); Michele Maria Venturini, Milan (IT); Claudia Palattella, Cologno Monzese (IT)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 17/896,963

(22) Filed: Aug. 26, 2022

(65) Prior Publication Data

US 2024/0071489 A1 Feb. 29, 2024

(51) Int. Cl.  
*G11C 13/00* (2006.01)

(52) U.S. Cl.  
CPC ........ *G11C 13/004* (2013.01); *G11C 13/0038* (2013.01); *G11C 2213/79* (2013.01)

(58) Field of Classification Search  
CPC .............. G11C 11/221; G11C 11/5657; G11C 11/5678; G11C 2013/0054; G11C 2213/73; G11C 11/2257; G11C 11/2273; G11C 13/003; G11C 2013/0045; G11C 13/0026; G11C 13/0004  
USPC ........................................................ 365/203  
See application file for complete search history.

(56) References Cited

U.S. PATENT DOCUMENTS 7,031,192 B1 * 4/2006 Park ................... G11C 16/3459  
                                                                  365/185.24  
11,508,455 B1 * 11/2022 Bedeschi ............ G11C 11/4091

* cited by examiner

*Primary Examiner* — Huan Hoang  
*Assistant Examiner* — Minh Dinh  
(74) *Attorney, Agent, or Firm* — Greenberg Traurig

(57) ABSTRACT

Systems and methods for operating a memory include a sensing circuitry connected to a memory cell through an address decoder, a precharge circuitry configured to be connected to the sensing circuitry during a precharge stage and at least partially disconnected from the sensing circuitry during a sensing stage immediately following the precharge stage, and a reference voltage provided to the precharge circuitry, wherein the reference voltage is mirrored to the memory cell by mirroring a current flowing from the precharge circuitry with a current flowing from the sensing circuitry during the precharge stage.

20 Claims, 5 Drawing Sheets

CASCODED SENSE AMPLIFIERS FOR SELF-SELECTING MEMORY

FIELD OF THE TECHNOLOGY

At least some embodiments disclosed herein relate to operating a memory array in general, and more particularly, but not limited to cascoded sense amplifiers for a self-selecting memory.

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0". In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

In one example, reading a set of data (e.g., a codeword, a page) is carried out by determining a read voltage (e.g., an estimated median of threshold voltages) of memory cells that store the set of data. In some cases, a memory device may include an array of PCM cells arranged in a 3D architecture, such as a cross-point architecture to store the set of data. In such architecture a resistance memory elements are placed at the cross-point of word-lines and bit-lines. Multiple such cross-point arrays can be stacked to form a high density memory.

PCM cells in a cross-point architecture may represent a first logic state (e.g., a logic 1, a SET state) associated with a first set of threshold voltages, or a second logic state (e.g., a logic 0, a RESET state) associated with a second set of threshold voltages. In some cases, data may be stored using encoding (e.g., error correction coding (ECC)) to recover data from errors in the data stored in the memory cells.

For resistance variable memory cells (e.g., PCM cells), one of a number of states (e.g., resistance states) can be set. For example, a single level cell (SLC) may be programmed to one of two states (e.g., logic 1 or 0), which can depend on whether the cell is programmed to a resistance above or below a particular level. As an additional example, various resistance variable memory cells can be programmed to one of multiple different states corresponding to multiple data states, e.g., 10, 01, 00, 11, 111, 101, 100, 1010, 1111, 0101, 0001, etc. Such cells may be referred to as multi state cells, multi-digit cells, and/or multi-level cells (MLCs).

The state of a resistance variable memory cell can be determined (e.g., read) by sensing current through the cell responsive to an applied interrogation voltage. The sensed current, which varies based on the resistance of the cell, can indicate the state of the cell (e.g., the binary data stored by the cell). The resistance of a programmed resistance variable memory cell can drift (e.g., shift) over time. Resistance drift can result in erroneous sensing of a resistance variable memory cell (e.g., a determination that the cell is in a state other than that to which it was programmed, among other issues).

A PCM cell, for example, may be programmed to a reset state (amorphous state) or a set state (crystalline state). A reset pulse (e.g., a pulse used to program a cell to a reset state) can include a relatively high current pulse applied to the cell for a relatively short period of time such that the phase change material of the cell melts and rapidly cools, resulting in a relatively small amount of crystallization. Conversely, a set pulse (e.g., a pulse used to program a cell to a set state) can include a relatively lower current pulse applied to the cell for a relatively longer time interval and with a slower quenching speed, which results in an increased crystallization of the phase change material.

A self-selecting memory cell may store one or more bits of data represented by different threshold voltages of the self-selecting memory cell. A programming pulse may be varied to establish the different threshold voltages by modifying one or more durations during which a fixed level of voltage or fixed level of current is maintained across the self-selecting memory cell.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
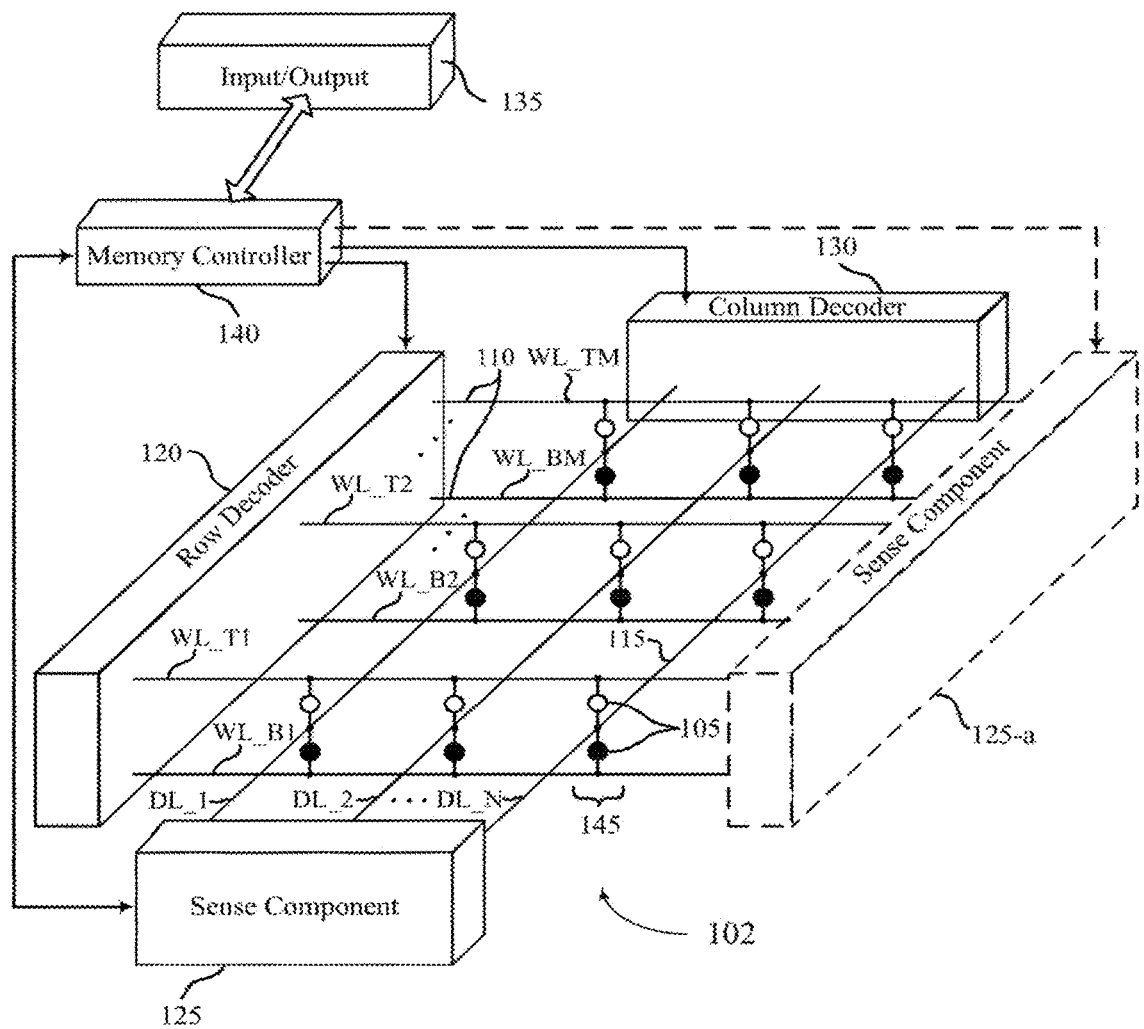
FIG. 1 illustrates an exemplary memory device having a three-dimensional array of memory cells that supports a multi-level self-selecting memory device.

The following disclosure describes various embodiments of a sense amplifier system for use in an exemplary vertical integrated cross-point array memory. At least some embodiments herein relate to a mirrored cascoded sense amplifier for use with self-selecting memory cells.

In one example, the sense amplifier system includes a sensing circuitry connected to a memory cell through an address decoder, a precharge circuitry configured to be connected to the sensing circuitry during a precharge stage and at least partially disconnected from the sensing circuitry during a sensing stage immediately following the precharge stage, and a reference voltage provided to the precharge circuitry, wherein the reference voltage is mirrored to the memory cell by mirroring a current flowing from the precharge circuitry with a current flowing from the sensing circuitry during the precharge stage.

In one example, the sensing circuitry includes a first PMOS transistor with a source connected to a high supply voltage and a drain connected to a drain of a first NMOS transistor, and a source the first NMOS transistor is connected to the address decoder. A gate and the drain of the first PMOS transistor is connected during the precharge stage.

In one example, the sense amplifier system further includes a third PMOS transistor with a source connected to the high supply voltage and a drain connected the drain of the first PMOS transistor, wherein the third PMOS transistor is turned off during the precharge stage and turned on during the sensing stage.

In one example, the precharge circuitry includes a second PMOS transistor with a source connected to the high supply voltage and a gate connected to a gate of the first PMOS transistor during the precharge stage, the second PMOS transistor being symmetrical in size to the first PMOS transistor, a second NMOS transistor with both a drain and a gate connected to a drain of the second PMOS transistor and a gate of the first NMOS transistor during the precharge stage, the second NMOS transistor being symmetrical in size to the first NMOS transistor, and a load circuitry replicating the address decoder connected between a source of the second NMOS transistor and the reference voltage.

In one example, the sense amplifier system further includes a first current generator connected to the source of the first NMOS transistor, and a second current generator connected to the source of the second NMOS transistor, wherein the first and second current generator generate a same amount of current.

In one example, the sense amplifier system further includes a first switch disposed between the gate of the first NMOS transistor and the gate of the second NMOS transistor, the first switch being configured to connect the gate of the first NMOS transistor and the gate of the second NMOS transistor during the precharge stage and disconnect the gate of the first NMOS transistor and the gate of the second NMOS transistor during the sensing stage, and a first capacitor connected to the gate of the first NMOS transistor.

In one example, the sense amplifier system further includes a second switch disposed between the gate of the first NMOS transistor with an initial voltage, wherein the second switch is configured to connect the initial voltage to the gate of the first NMOS transistor during a first step of the sensing stage, and disconnect the initial voltage from the gate of the first NMOS transistor during a second step of the sensing stage, the second step being immediately subsequent to the first step.

In one example, the sense amplifier system further includes a third switch disposed between the gate of the first PMOS transistor and the gate of the second PMOS transistor, the third switch being configured to connect the gate of the first PMOS transistor and the gate of the second PMOS transistor during the precharge stage and disconnect the gate of the first PMOS transistor and the gate of the second PMOS transistor during the sensing stage, and a second capacitor connected to the gate of the first PMOS transistor.

A threshold voltage of a memory cell is such that when the voltage applied across the memory cell is increased to above the threshold voltage, the memory cell switches by changing rapidly or abruptly, snapping (e.g., for a chalcogenide memory cell), or jumping from a non-conductive state to a conductive state. The non-conductive state allows a small leak current to go through the memory cell; and in contrast, the conductive state allows more than a threshold amount of current to go through. Thus, a memory device can use a sensor (e.g., sense amplifier) to detect the change, or determine the conductive/non-conductive state of the memory device at one or more applied voltages, to evaluate or classify the level of the threshold voltage of the memory cell and thus its stored data.

The threshold voltage of a memory cell being configured/programmed to be in different voltage regions can be used to represent different data values stored in the memory cell. For example, the threshold voltage of the memory cell can be programmed to be in any of four predefined voltage regions; and each of the regions can be used to represent the bit values of a different two-bit data item. Thus, when given a two-bit data item, one of the four voltage regions can be selected based on a mapping between two-bit data items and voltage regions; and the threshold voltage of the memory cell can be adjusted, programmed, or configured to be in the selected voltage region to represent or store the given two-bit data item. To retrieve, determine, or read the data item from the memory cell, one or more read voltages can be applied across the memory cell to determine which of the four voltage regions contain the threshold voltage of the memory cell. The identification of the voltage region that contains the threshold voltage of the memory cell provides the two-bit data item that has been stored, programmed, or written into the memory cell.

For example, a memory cell can be configured or programmed to store a one-bit data item in a Single Level Cell (SLC) mode, or a two-bit data item in a Multi-Level Cell (MLC) mode, or a three-bit data item in a Triple Level Cell (TLC) mode, or a four-bit data item in Quad-Level Cell (QLC) mode.

Sense amplifiers detect a characteristic associated with memory cells of the memory array. The characteristic can be, for example, a voltage and/or current associated with a selected memory cell.

FIG. 1 illustrates an exemplary memory device having a three-dimensional array of memory cells that supports a multi-level self-selecting memory device. Operations such as reading and writing may be performed on memory cells 105 by activating or selecting access line 110 and digit line 115. In some embodiments, access lines 110 may also be known as word lines 110, and bit lines 115 may also be known digit lines 115. References to word lines and bit lines, or their analogues, are interchangeable without loss of understanding or operation. Activating or selecting a word line 110 or a digit line 115 may include applying a voltage to the respective line.

In some architectures, the logic storing device of a cell (e.g., a resistor in a PCM cell, a capacitor in a FeRAM cell) may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Upon selecting a memory cell 105, the resulting signal may be used to determine the stored logic state. In some cases, a first logic state may correspond to no current or a negligibly small current, whereas a second logic state may correspond to a finite current. In some cases, a memory cell 105 may include a self-selecting memory cell having two terminals and may not need a separate selection component. As such, one terminal of the self-selecting memory cell may be electrically connected to a word line 110 and the other terminal of the self-selecting memory cell may be electrically connected to a digit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some embodiments, a series of predetermined voltages may be applied to determine one of three or more threshold voltage levels stored in a self-selecting memory cell. The predetermined voltage levels may increase in magnitude to detect a particular threshold voltage of the self-selecting memory cell in linear mode. Alternatively, the predetermined voltage levels may increase or decrease in magnitude to detect a particular threshold voltage of the self-selecting memory cell in a binary search mode. The predetermined voltage levels may have a same polarity with a voltage used to program the self-selecting memory cell. The predetermined voltage levels may have an opposite polarity with a voltage used to program the self-selecting memory cell. A range of the predetermined voltage may be determined by a range of the threshold voltage of the self-selecting memory cell.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging the sense component 125-a (in a dashed box). An ordinary person skilled in the art would appreciate that sense component may be associated either with column decoder or row decoder without losing its functional purposes.

Figure 2:
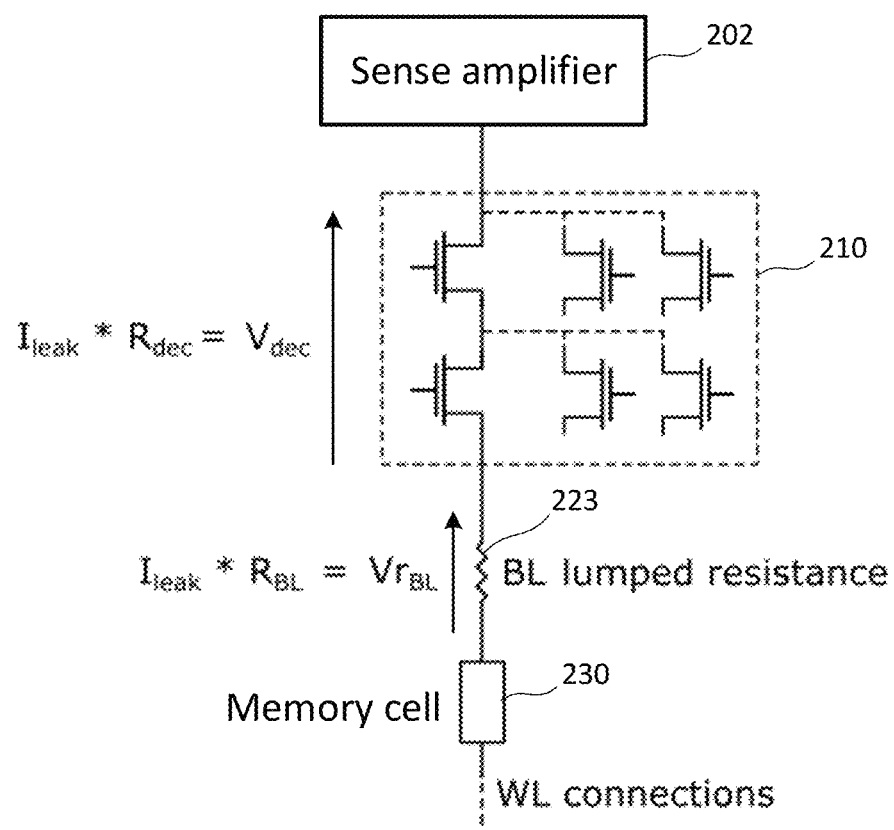
FIG. 2 is a schematic diagram illustrating a sense amplifier coupled to an exemplary memory cell.

FIG. 2 is a schematic diagram illustrating a sense amplifier 202 coupled to an exemplary memory cell 230. There are multiple memory cells 230 that are selectively sensed by the sense amplifier 202 through an address decoder 210. The address decoder 210 includes multiple transistors producing a leakage current $I_{leak}$, which causes a voltage drop ($V_{dec}=I_{leak} \times R_{dec}$) across the address decoder 210 and a voltage drop ($Vr_{BL}=I_{leak} \times R_{BL}$) across a bitline 223. Therefore, the sense amplifier 202 is actually sensing memory cell voltage plus $V_{dec}$ and $Vr_{BL}$. As $V_{dec}$ and $Vr_{BL}$ change from cell to cell, they introduce unreliability to sensing the truth state of the memory cells.

Figure 3:
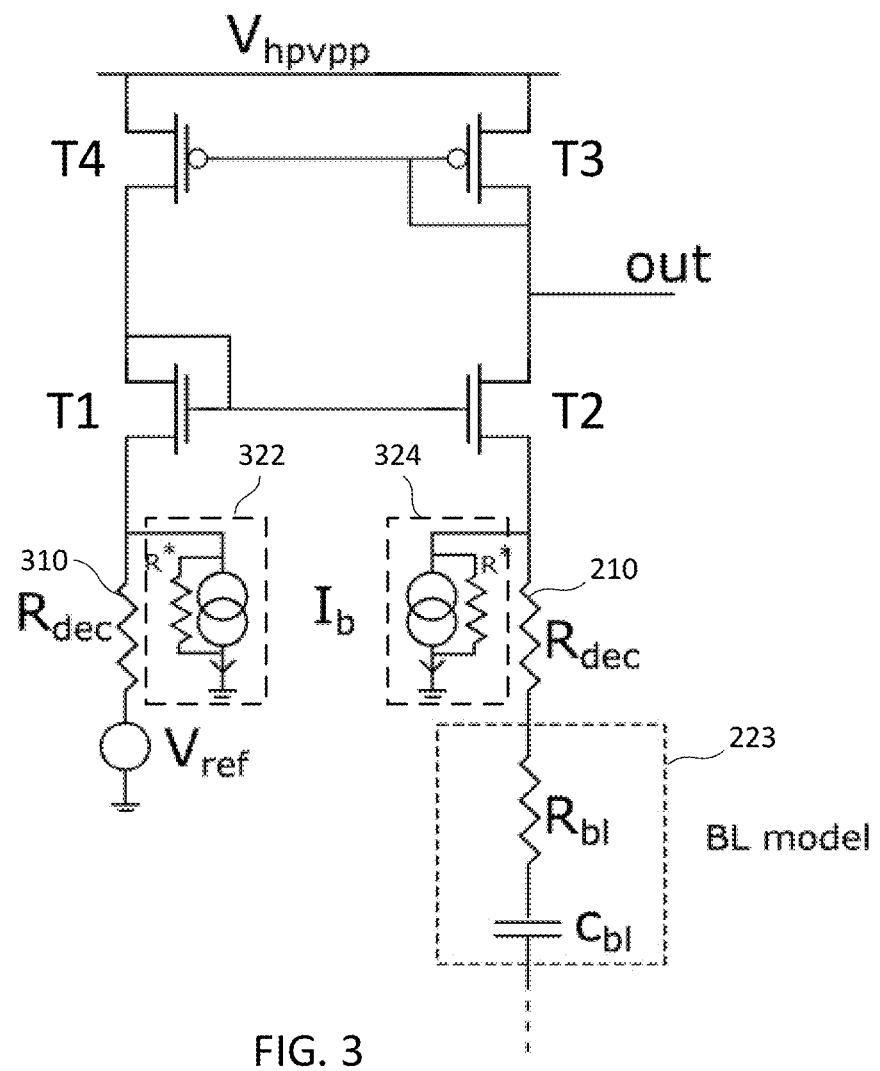
FIG. 3 is a schematic diagram of a cascoded sense amplifier according embodiments of the present disclosure.

FIG. 3 is a schematic diagram of a cascoded sense amplifier according embodiments of the present disclosure. The cascoded sense amplifier includes two exemplary NMOS transistors T1 and T2, and two exemplary PMOS transistor T3 and T4, a pair of identical current generators 322 and 324, an address decoder replicate circuit 310 and reference voltage Vref. The transistors T2 and T3 are connected in a cascode configuration, i.e., a drain of the NMOS transistor T2 is connected to a drain of the PMOS transistor T3 and provide an output of the sense amplifier. A source of the PMOS transistor is connected to a high supply voltage Vhpvpp; and a source of the NMOS transistor is connected to the address decoder 210. A gate of the PMOS transistor T3 is connected to the drain thereof.

Referring again to FIG. 3, the NMOS transistor T1 mirrors and is placed in a vicinity of the NMOS transistor T2 to minimize mismatch. The PMOS transistor T4 also mirrors and is placed in a vicinity of the PMOS transistor T3 to minimize mismatch. A gate and drain of the NMOS transistor T1 are tied together and connected to a drain of the PMOS transistor T4. A source of the PMOS transistor T4 is connected to the high supply voltage Vhpvpp. With such configuration, a source-drain current of the PMOS transistor T4 mirrors a source-drain current of the PMOS transistor T3. A source of the NMOS transistor T1 is connected to a first terminal of the address decoder replicate circuit 310. A second terminal of the address decoder replicate circuit 310 is provided with the reference voltage Vref. The current generator 322 is connected to the source of the transistor T1; and the current generator 324 is connected to the source of the transistor T2.

Referring again to FIG. 3, with the aforementioned mirroring configurations, the Vref is mirrored at the bitline 223, so that sense amplifier shown in FIG. 3 compensates variations caused by address decoder leakage and IR voltage as well as device variation caused by the manufacturing process.

However, in order to compensate bitline variations, a compensation resistance (not shown) can be inserted between the replicate address decoder 310 and the reference voltage Vref. The compensation resistance is programmed variable to compensate different bitline lengths.

In embodiments, the cascoded sense amplifier shown in FIG. 3 operates in two sequential stages: a precharge stage followed by a sensing stage. During the precharge stage, the Vref is forced onto the bitline 223; and during the sensing stage, the memory cell current is read out and reflected as a voltage at the output node. Therefore, the left branch including the transistors T4, T1, the current generator 322, the replicate address decoder 310 and the reference voltage Vref are only used during the precharge stage for precharging the right branch. The right branch including transistors T3 and T2, the current generator 324 and the address decoder 210 is symmetrical in size and preferably in layout as well to the left branch. Due to the circuit symmetry, all the voltages and currents in the left branch are mirrored exactly to the right branch.

Figure 4:
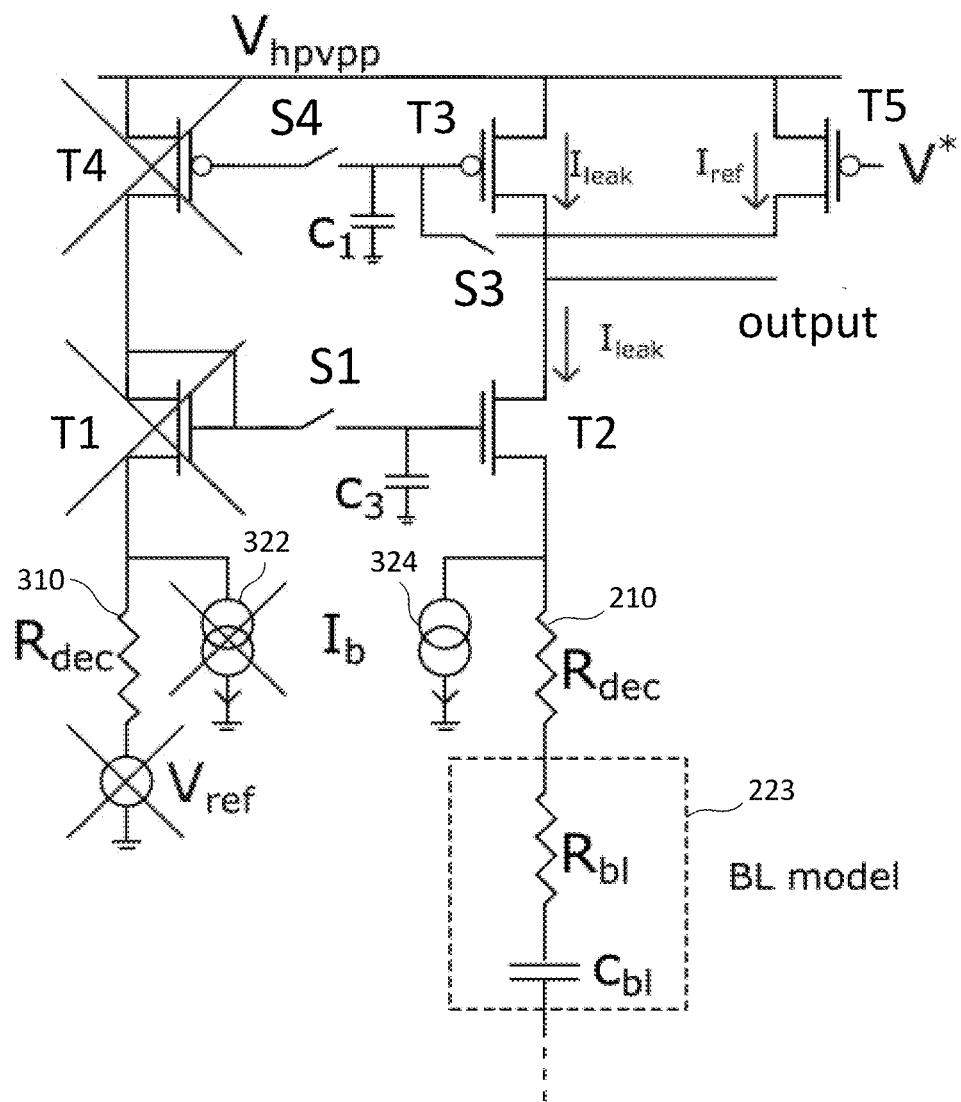
FIG. 4 is a schematic diagram illustrating an exemplary operation of the cascoded sense amplifier according to embodiments of the present disclosure.

FIG. 4 is a schematic diagram illustrating an exemplary operation of the cascoded sense amplifier according to embodiments of the present disclosure. A switches S1 is added between gates of the NMOS transistors T1 and T2; a switch S4 is added between gates of the PMOS transistors; and a switch S3 is added between the gate and drain of the PMOS transistor T3. In an embodiment, the switches S1, S3 and S4 are implemented by transistors with gates controlling their open and close. During the precharge stage, the switches S1, S3 and S4 are closed, so that Vref is mirrored to the bitline 223 and gate biases of the PMOS transistor T3 and the NMOS transistor T2 are stored in capacitors C1 and C3, respectively. At an end of the precharge stage, the sense amplifier should reach an equilibrium point.

During the sensing stage, the switches S1, S3 and S4 are opened, so that the left branch is disengaged from the right branch. However, as the bias voltage of the transistors T2 and T3 are stored in the capacitors C3 and C1, the reference voltage Vref is still applied to the memory cell through the bitline 223, and the transistors T2 and T3 are properly biased for sensing.

Referring again to FIG. 4, a source-and-drain of a PMOS transistor T5 is added between the output node and the high supply voltage Vhpvpp. During the sensing stage, the PMOS transistor is turned on and generate a current Iref. Once the memory cell current is greater than Iref+$I_{leak}$, the output voltage is lowered to a predetermined voltage. Otherwise, the Iref forces the output node to close to Vhpvpp. Adding the transistor T5 is because $I_{leak}$ is generally very small, not enough to quickly pull the output node to Vhpvpp. As the Iref is only needed during the sensing stage, the PMOS transistor T5 is turned off by a high voltage V* at a gate of the PMOS transistor T5 during the precharge state. Alternatively, a transistor switch (not shown) may be used to disconnect the transistor T5 from the output node.

As shown in FIG. 4, when the switches S1, S3 and S4 are closed during the precharge stage, the transistors T1, T2, T3 and T4 form a feedback loop which is intrinsically positive. It is important to ensure the stability of the sense amplifier once the equilibrium point is reached and to avoid any oscillations due to perturbations.

In order for the sense amplifier to work properly, an absolute value of the loop gain of the feedback loop must be smaller than 1 in correspondence of a zero phase shift. Adjusting a ratio of the cross of the transistors T1 vs T2 and T3 vs T4, or reducing a mirroring ratio of the left branch compared to the right branch can improve the stability of the sense amplifier circuit. However, the stability is still critical due to the unrelatability of the line capacitance and of the line resistance.

Figure 5:
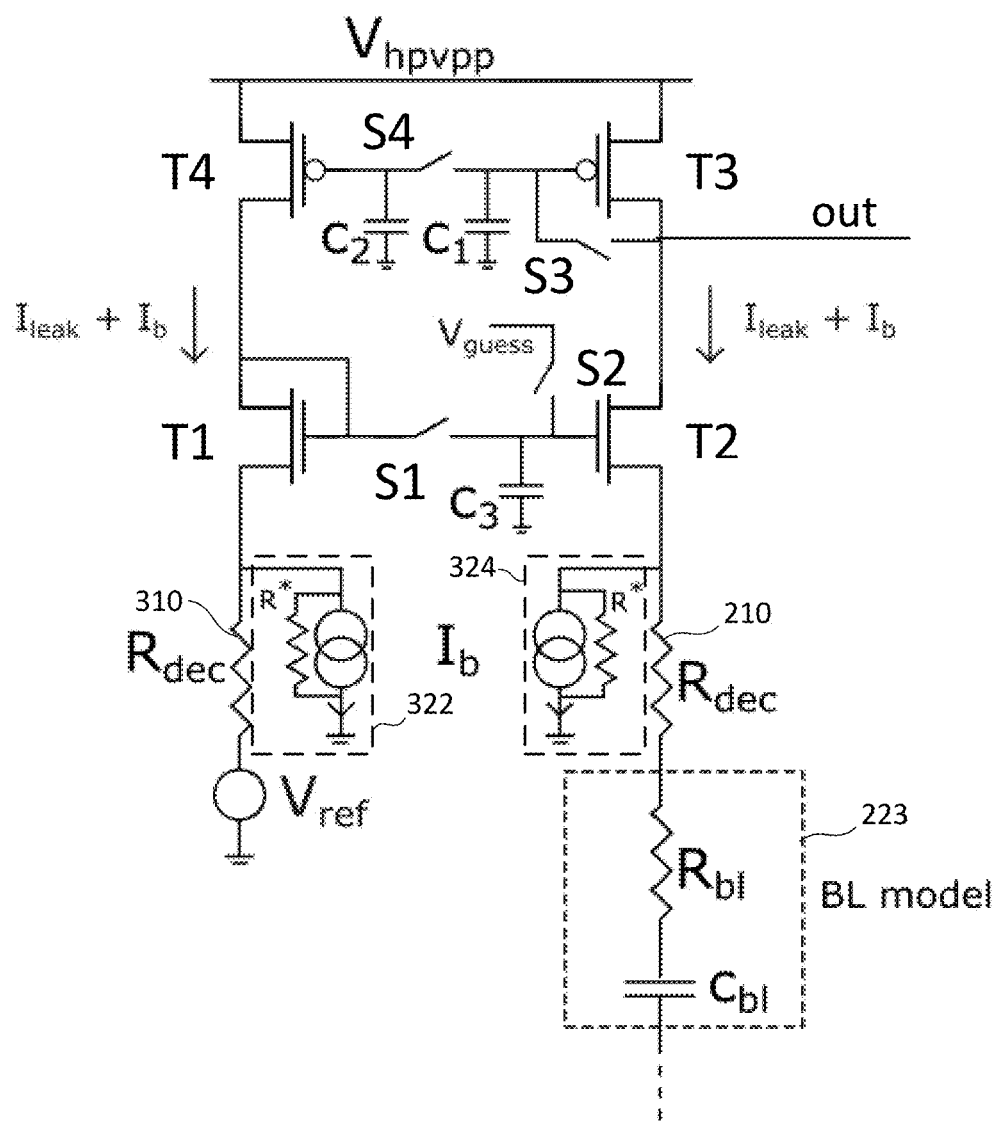
FIG. 5 is a schematic diagram of a sense amplifier with enhanced stability according to embodiments of the present disclosure.

FIG. 5 is a schematic diagram of a sense amplifier with enhanced stability according to embodiments of the present disclosure. Comparing to FIG. 4, an initial voltage Vguess is applied to the gate of the NMOS transistor T2 through a switch S2 and a capacitor C2 is connected to the gate of the PMOS transistor T4. In operation, the sensing stage is divided into two sequential steps to improve circuit stability. During a first step, the switches S2, S3 and S4 are closed while the switch S1 is open, and the initial voltage Vguess is driven to the gate of NMOS transistor T2 and to the memory cell. A resulting leakage sets the voltage on the gate of the PMOS transistor T3. In an example, the Vguess is higher than Vref by a predetermined amount.

During a second step following the first step, the switches S2 and S3 are open while the switches S1 and S4 are closed. Voltages stored in the capacitors C1 and C2 sets the current in both left and right branches and a voltage generated at the gate of the NMOS transistor T1 is pushed onto the gate of the NMOS transistor T2. In an embodiment, the above two steps are repeated multiple times to achieve a multistep feedback, so that the right branch current is mirrored in the left branch to generate the required voltage (Vref) at the bitline 223. In a subsequent sensing operation, the switch S4 is opened to turn off the left branch.

The description and drawings are illustrative and are not to be construed as limiting. Numerous specific details are described to provide a thorough understanding. However, in certain instances, well-known or conventional details are not described in order to avoid obscuring the description. References to one or an embodiment in the present disclosure are not necessarily references to the same embodiment; and, such references mean at least one.

As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

In various embodiments, hardwired circuitry may be used in combination with software and firmware instructions to implement the techniques. Thus, the techniques are neither limited to any specific combination of hardware circuitry and software nor to any particular source for the instructions executed by a computing device.

In one example, a computing device is a controller of a memory system. The controller includes a processing device and memory containing instructions executed by the processing device to control various operations of the memory system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A memory circuit comprising:
   a sensing circuitry connected to a memory cell through an address decoder;
   a precharge circuitry configured to be connected to the sensing circuitry during a precharge stage and at least partially disconnected from the sensing circuitry during a sensing stage immediately following the precharge stage; and
   a reference voltage provided to the precharge circuitry, wherein the reference voltage is mirrored to the memory cell by mirroring a current flowing from the precharge circuitry with a current flowing from the sensing circuitry during the precharge stage;

wherein the sensing circuitry comprises a first PMOS transistor with a source connected to a high supply voltage and a drain connected to a drain of a first NMOS transistor, and a source of the first NMOS transistor is connected to the address decoder.

2. The memory circuit of claim 1, wherein a gate and the drain of the first PMOS transistor is connected during the precharge stage.

3. The memory circuit of claim 1, wherein the sensing circuitry provides an output voltage at the drain of the PMOS transistor, the output voltage reflecting a state of the memory cell.

4. The memory circuit of claim 1, further comprising a second PMOS transistor with a source connected to the high supply voltage and a drain connected to the drain of the first PMOS transistor, wherein the second PMOS transistor is turned off during the precharge stage and turned on during the sensing stage.

5. The memory circuit of claim 4, wherein the precharge circuitry comprises:
a third PMOS transistor with a source connected to the high supply voltage and a gate connected to a gate of the first PMOS transistor during the precharge stage, the third PMOS transistor being symmetrical in size to the first PMOS transistor;
a second NMOS transistor with a drain connected to a drain of the third PMOS transistor and a gate coupled to a gate of the first NMOS transistor during the precharge stage, the second NMOS transistor being symmetrical in size to the first NMOS transistor; and
a load circuitry replicating the address decoder connected between a source of the second NMOS transistor and the reference voltage.

6. The memory circuit of claim 5, wherein the load circuitry replicates the address decoder and one of a plurality of bitlines connected to the address decoder.

7. The memory circuit of claim 5, wherein the gate and drain of the second NMOS transistor are connected.

8. The memory circuit of claim 5, further comprising:
a first current generator connected to the source of the first NMOS transistor; and
a second current generator connected to the source of the second NMOS transistor, wherein the first and second current generator generate a same amount of current.

9. The memory circuit of claim 5, further comprising:
a first switch disposed between the gate of the first NMOS transistor and the gate of the second NMOS transistor, the first switch being configured to connect the gate of the first NMOS transistor and the gate of the second NMOS transistor during the precharge stage and disconnect the gate of the first NMOS transistor and the gate of the second NMOS transistor during the sensing stage; and
a first capacitor connected to the gate of the first NMOS transistor.

10. The memory circuit of claim 9, further comprising a second switch disposed between the gate of the first NMOS transistor with an initial voltage, wherein the second switch is configured to connect the initial voltage to the gate of the first NMOS transistor during a first step of the sensing stage, and disconnect the initial voltage from the gate of the first NMOS transistor during a second step of the sensing stage, the second step being immediately subsequent to the first step.

11. The memory circuit of claim 5, further comprising:
a third switch disposed between the gate of the first PMOS transistor and the gate of the second PMOS transistor, the third switch being configured to connect the gate of the first PMOS transistor and the gate of the second PMOS transistor during the precharge stage and disconnect the gate of the first PMOS transistor and the gate of the second PMOS transistor during the sensing stage; and
a second capacitor connected to the gate of the first PMOS transistor.

12. A memory circuit comprising:
a sensing circuitry connected to a memory cell through an address decoder, the sensing circuitry comprising:
a first PMOS transistor with a source connected to a high supply voltage and a drain connected to a drain of a first NMOS transistor, and
a source of the first NMOS transistor is connected to the address decoder; and
a precharge circuitry configured to be connected to the sensing circuitry during a precharge stage and at least partially disconnected from the sensing circuitry during a sensing stage immediately following the precharge stage, the precharge circuitry comprising:
a second PMOS transistor with a source connected to the high supply voltage and a gate connected to a gate of the first PMOS transistor during the precharge stage, the second PMOS transistor being symmetrical in size to the first PMOS transistor,
a second NMOS transistor with a drain connected to a drain of the second PMOS transistor and a gate coupled to a gate of the first NMOS transistor during the precharge stage, the second NMOS transistor being symmetrical in size to the first NMOS transistor, and
a load circuitry replicating the address decoder connected between a source of the second NMOS transistor and a reference voltage,
wherein the reference voltage is mirrored to the memory cell by mirroring a current flowing from the precharge circuitry with a current flowing from the sensing circuitry during the precharge stage.

13. The memory circuit of claim 12, wherein a gate and the drain of the first PMOS transistor is connected during the precharge stage.

14. The memory circuit of claim 12, further comprising a third PMOS transistor with a source connected to the high supply voltage and a drain connected to the drain of the first PMOS transistor, wherein the third PMOS transistor is turned off during the precharge stage and turned on during the sensing stage.

15. The memory circuit of claim 12, wherein the gate and drain of the second NMOS transistor are connected.

16. The memory circuit of claim 12, further comprising:
a first current generator connected to the source of the first NMOS transistor; and
a second current generator connected to the source of the second NMOS transistor, wherein the first and second current generator generate a same amount of current.

17. The memory circuit of claim 12, further comprising:
a first switch disposed between the gate of the first NMOS transistor and the gate of the second NMOS transistor, the first switch being configured to connect the gate of the first NMOS transistor and the gate of the second NMOS transistor during the precharge stage and disconnect the gate of the first NMOS transistor and the gate of the second NMOS transistor during the sensing stage; and a first capacitor connected to the gate of the first NMOS transistor.

18. The memory circuit of claim 17, further comprising a second switch disposed between the gate of the first NMOS transistor with an initial voltage, wherein the second switch is configured to connect the initial voltage to the gate of the first NMOS transistor during a first step of the sensing stage, and disconnect the initial voltage from the gate of the first NMOS transistor during a second step of the sensing stage, the second step being immediately subsequent to the first step.

19. The memory circuit of claim 12, further comprising:
a third switch disposed between the gate of the first PMOS transistor and the gate of the second PMOS transistor, the third switch being configured to connect the gate of the first PMOS transistor and the gate of the second PMOS transistor during the precharge stage and disconnect the gate of the first PMOS transistor and the gate of the second PMOS transistor during the sensing stage; and a second capacitor connected to the gate of the first PMOS transistor.

20. A method comprising:
connecting a precharge circuitry to a sensing circuitry, the sensing circuitry being connected to a memory cell through an address decoder;

providing a reference voltage to a load circuitry of the precharge circuitry, the load circuitry replicating the address decoder;

precharging the memory cell to the reference voltage by mirroring a current flowing from the precharge circuitry to a current flowing from the sensing circuitry; and sensing the memory cell after at least partially disconnecting the precharge circuitry from the sensing circuitry.

* * * * *